United States Patent
Li et al.

(10) Patent No.: US 7,858,914 B2
(45) Date of Patent: Dec. 28, 2010

(54) METHOD AND APPARATUS FOR REDUCING DARK CURRENT AND HOT PIXELS IN CMOS IMAGE SENSORS

(75) Inventors: Xiangli Li, Boise, ID (US); Richard Mauritzson, Meridian, ID (US); Xiaofeng Fan, Boise, ID (US); John Ladd, San Jose, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/942,847

(22) Filed: Nov. 20, 2007

(65) Prior Publication Data
US 2009/0127437 A1    May 21, 2009

(51) Int. Cl.
H04N 3/14       (2006.01)
H04N 5/335      (2006.01)
H04N 5/217      (2006.01)

(52) U.S. Cl. .................. 250/208.1; 348/308; 438/73
(58) Field of Classification Search .............. 250/208.1, 250/214.1; 348/307–310
See application file for complete search history.

(56) References Cited

U.S. PATENT DOCUMENTS

| | | | |
|---|---|---|---|
| 5,831,675 A | 11/1998 | Ueno | |
| 6,232,626 B1 | 5/2001 | Rhodes | |
| 6,611,037 B1 | 8/2003 | Rhodes | |
| 6,809,359 B2 | 10/2004 | Yamada | |
| 7,064,406 B2 | 6/2006 | Mouli | |
| 7,115,855 B2 | 10/2006 | Hong | |
| 7,119,322 B2 | 10/2006 | Hong | |
| 7,187,020 B2 | 3/2007 | Mabuchi | |
| 7,279,395 B2 * | 10/2007 | Mouli | ........................ 438/424 |
| 2002/0009824 A1 | 1/2002 | Maeda | |
| 2005/0248673 A1 | 11/2005 | Fowler | |
| 2006/0033129 A1 | 2/2006 | Mouli | |
| 2006/0082667 A1 | 4/2006 | Rhodes | |
| 2006/0146158 A1 | 7/2006 | Toros et al. | |
| 2006/0169870 A1 | 8/2006 | Silsby et al. | |
| 2006/0180741 A1 | 8/2006 | Agranov et al. | |
| 2006/0231733 A1 | 10/2006 | Boemler | |

(Continued)

FOREIGN PATENT DOCUMENTS

JP    2006093815    4/2006

(Continued)

OTHER PUBLICATIONS

P.K. Hanumolu, "Design of Low Noise, Low Power Linear CMOS Image Sensors", Worcester Polytechnic Institute, Apr. 30, 2001, pp. 1-81.

(Continued)

Primary Examiner—Tony Ko
(74) Attorney, Agent, or Firm—RatnerPrestia

(57) ABSTRACT

Methods and apparatuses for reducing dark current and hot pixels in CMOS image sensors. A pixel apparatus includes a photosensor capable of generating dark current, a floating diffusion region coupled to the photosensor by way of a charge transfer transistor, a rest transistor connected between the floating diffusion region and an array pixel supply voltage. The array supply voltage varies between first and second voltages when sampling pixel signals from the pixel.

14 Claims, 5 Drawing Sheets

U.S. PATENT DOCUMENTS

| | | |
|---|---|---|
| 2006/0279649 A1 | 12/2006 | Cole |
| 2007/0012966 A1 | 1/2007 | Park |
| 2007/0020791 A1 | 1/2007 | Hsu et al. |
| 2007/0031987 A1 | 2/2007 | Mouli et al. |
| 2007/0045679 A1 | 3/2007 | McKee et al. |
| 2007/0064137 A1 | 3/2007 | Kanbe |
| 2007/0097241 A1 | 5/2007 | Mabuchi |
| 2007/0158771 A1 | 7/2007 | Hynecek |

FOREIGN PATENT DOCUMENTS

| | | | |
|---|---|---|---|
| JP | 2007081358 | | 3/2007 |
| KR | 20050018512 | | 2/2005 |
| WO | WO 03/054922 | * | 7/2003 |
| WO | WO 2004/044989 A1 | | 5/2004 |
| WO | WO 2007/066996 A1 | | 6/2007 |

OTHER PUBLICATIONS

E. R. Fossum, "Digital Camera System On A Chip", IEEE, May-Jun. 1998, vol. 18, No. 3, pp. 8-15.

I. Takayanagi et al., "Dark Current Reduction in Stacked-Type CMOS-APS for Charged Particle Imaging", IEEE, Jan. 2003, vol. 50, No. 1, pp. 70-76.

N. Kawai et al., "Measurement of Low-Noise Column Readout Circuits for CMOS Image Sensors", IEEE, Jul. 2006, vol. 53, No. 7, pp. 1737-1739.

Wang, Ching-Chun, and Sodini, Charles G., The Effect of Hot Carriers of the Operation of CMOS Active Pixel Sensors, International Electron Devices Meeting, 2001, IEDM. Technical Digest, Washington, DC, Dec. 2-5, 2001: New York, NY, IEEE, US Dec. 2, 2001, pp. 24.5-1-24.5-4, XPO10575190.

Pherai, Shantisaroop, Authorized Officer WIPO, International Search Report, PCT/US2008/083338, Feb. 12, 2009.

* cited by examiner

METHOD AND APPARATUS FOR REDUCING DARK CURRENT AND HOT PIXELS IN CMOS IMAGE SENSORS

BACKGROUND OF THE INVENTION

The present invention relates to the field of CMOS image sensors and, more particularly, to reducing dark current and hot pixels in CMOS image sensors.

Image sensors, including complimentary metal oxide semiconductor (CMOS) image sensors and charge-coupled devices (CCD), may be used in many different digital imaging applications to capture scenes. An image sensor may include an array of pixels. Each pixel in the array may include at least a photosensitive element for outputting a signal having a magnitude proportional to the intensity of incident light contacting the photosensitive element. When exposed to incident light to capture a scene, each pixel in the array may output a signal having a magnitude corresponding to an intensity of light at one point in the scene. The signals output from each photosensitive element may be processed to form an image representing the captured scene.

As pixels are made smaller, pixel elements may be located closer together in the pixel, resulting in increased risk of cross-talk between adjacent pixels. Further, the supply voltage node must be located close to the photodiode. Shallow trench isolation (STI) regions, which may be dielectric-filled trenches formed in the substrate of the image sensor, may be used to isolate pixels and pixel elements from each other.

While helping to electrically isolate pixels and pixel elements, the STI regions may also create problems in the operation of the pixel cell. For example, STI boundaries may have a higher defect density than the substrate, creating a higher density of "trap sites" along the STI boundaries as compared to the silicon/gate oxide interface or silicon surface that can "trap" electrons or holes. Trap sites may result from defects along the silicon dioxide/silicon interface between the STI boundaries and the silicon substrate. For example, dangling bonds or broken bonds along the silicon dioxide/silicon interface may trap electrons or holes.

Trapped electrons or holes may generate a proportional current at the trap site. The current generation from trap sites inside or near the photosensor may contribute to dark current (i.e., electrical current in the photosensor in the absence of light) in CMOS image sensors since a constant charge may be leaking in the photodiode. Because the readout circuitry of the image sensor may not distinguish between sources of charge in the photosensitive element, dark current may be added to the magnitude of the signal output from the pixel, thus making the pixel appear brighter in the produced image than that point actually appeared in the scene. Such a pixel may be referred to as a hot pixel.

In conventional image sensors, a supply voltage may be applied to the photodiode and the floating diffusion during reset to deplete the photodiode of charge, returning the photodiode to its pinned voltage, and to reset the floating diffusion region. It may be desirable to maintain the supply voltage at a high voltage level (e.g., 2.8 v for mobile applications and 3.3 v for digital camera applications) to reset the floating diffusion to a high voltage and to fully deplete the photodiode. The high supply voltage applied to the supply voltage node may deplete the active area connected to the supply voltage node and may also deplete the photodiode to its pinned voltage (e.g., 1.5 V). When this occurs, a field may be generated between the supply voltage node and the photodiode, which may pull the photodiode depletion region close to the STI edge. Accordingly, dark current may increase at photodiode and STI interface.

DETAILED DESCRIPTION OF THE INVENTION

The present invention may reduce dark current at photodiode and STI interfaces due to the electrical field generated between the supply voltage node and the photodiode. This is achieved by reducing the supply voltage so that it is closer to, equal to, or lower than the pinned voltage of the photodiode during column readout. When the supply voltage equals the pinned voltage of the photodiode, no field is generated. Accordingly, the present invention may reduce dark current at the photodiode and STI interface by reducing or eliminating the electrical field between the supply voltage node and the photodiode.

Figure 1:
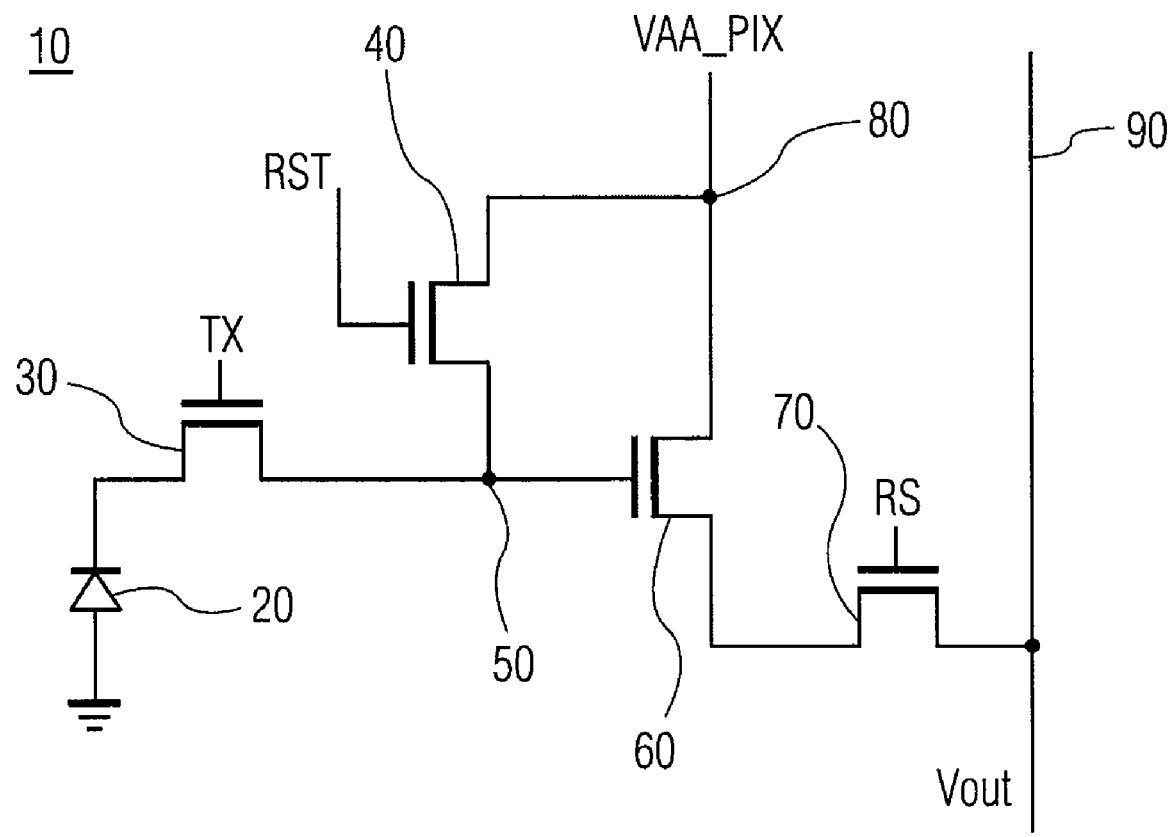
FIG. 1 is a diagram of a pixel according to an embodiment of the present invention.

A pixel 10, according to the present invention, is shown in FIG. 1. As shown, pixel 10 includes four transistors 30, 40, 60 and 70, photodiode 20, floating diffusion region 50, column readout line 90 and array supply voltage node 80. The four transistors include transfer gate 30, reset transistor 40, source follower transistor 60 and row select transistor 70. In this pixel, a pinned photodiode is used as photodiode 20. Photodiode 20 may, however, be any photosensitive element, which may include photogates, photoconductors, p-n junction photodiodes, Schottky photodiodes or other suitable photoconversion devices. Further, pixel 10 is a four transistor pixel. Pixel 10, however, may have any suitable layout.

Figure 2:
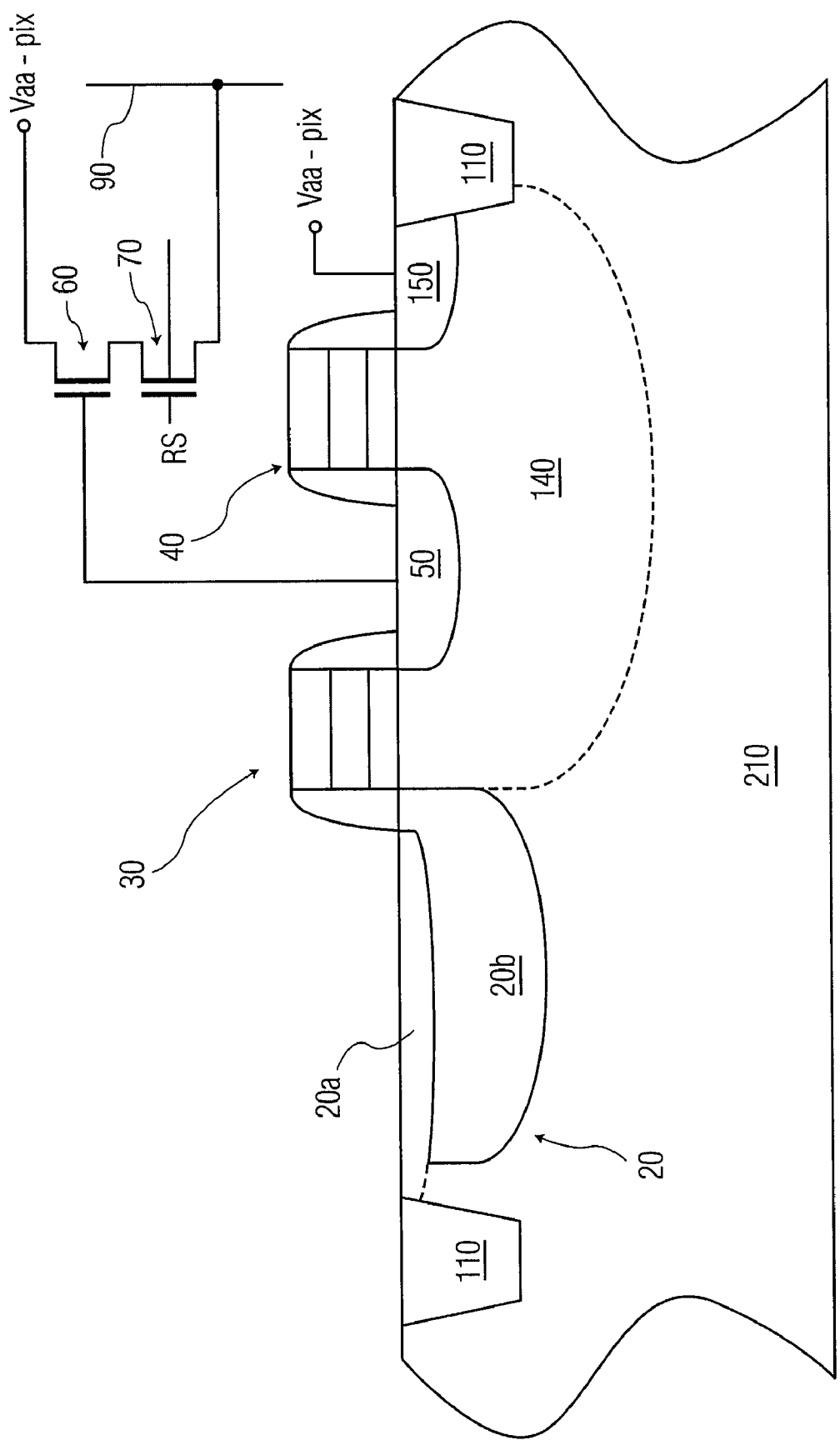
FIG. 2 is a cross-sectional diagram of the pixel of FIG. 1.

A cross-sectional view of the structure of pixel 10 is shown in FIG. 2. As shown, pixel 10 includes semiconductor substrate 210, photodiode 20 formed in semiconductor substrate 210, p-well 140 formed in semiconductor substrate 210 and floating diffusion region 50 formed in p-well 140. Photodiode 20 includes a p-n junction formed between p-type region 20a and n-type region 20b. Transfer gate 30 is coupled between photodiode 20 and floating diffusion region 50 for transferring charge therebetween. Reset transistor 40 is coupled between floating diffusion region 50 and source/drain region 150 for resetting floating diffusion region 50 using Vaa_pix prior to charge transference. Row select transistor 70 is coupled between source follower transistor 60 and column readout line 90 for sampling the voltage that is transferred across source follower transistor 60.

Pixel 10 further includes shallow trench isolation regions (STIs) 110. STIs 110 may be formed by etching trenches into substrate 210 and filling the trenches with a dielectric. As shown in FIG. 2, STIs 110 are formed on outer edges of pixel 10. In this embodiment, STIs 110 provide physical and electric barriers between pixel 10 and neighboring pixels (not shown) in an image sensor. While pixel 10 includes STIs on the outer edges of the photodiode to isolate photodiode 40 from neighboring photodiodes, STIs may also be formed at different places on a substrate, for example, to isolate the photodiodes from the transistor circuitry within pixel 10 or to isolate devices or circuitry from other devices on circuitry. The isolation regions could also be formed using a "locos" process vs. STI.

Figure 3:
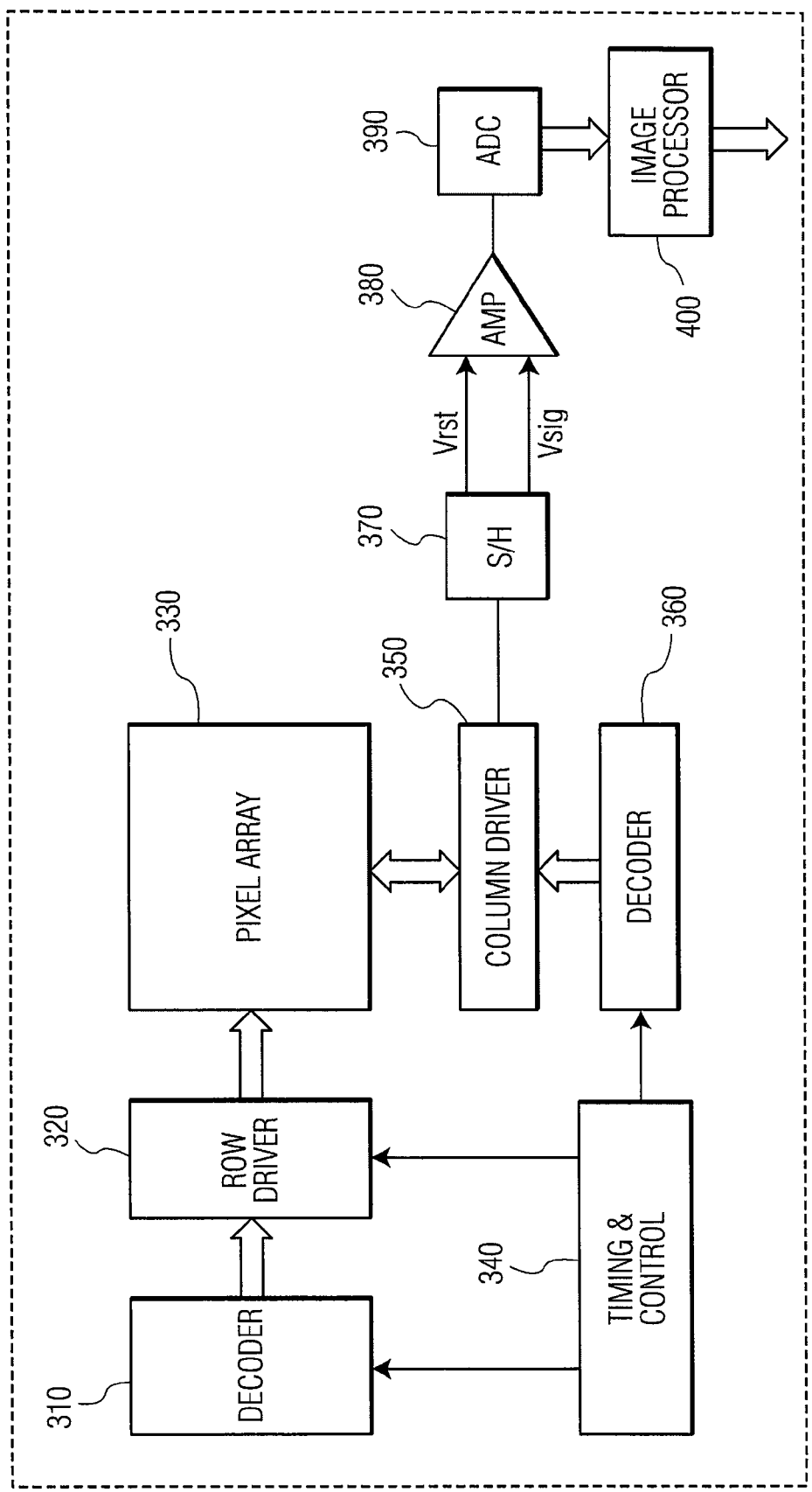
FIG. 3 is a block diagram of an image sensor including at least one of the pixels of FIGS. 1 and 2.

FIG. 3 illustrates a block diagram of CMOS image sensor 301 including pixel array 330. Pixel array 330 may include a plurality of pixels arranged in a predetermined number of columns and rows. For sake of clarity, CMOS image sensor 301 includes at least one pixel 100 of FIG. 1 or 2; however, this is not intended to limit CMOS image sensor 301 to only such an embodiment.

All the pixels in the same row may be sampled at the same time by applying a row select line signal RS to row select transistor 70 of the selected row. Specific pixels in each column may be selectively output by respective column select lines (e.g., column readout line 90 of FIG. 1). A plurality of row and column lines may be provided for the entire array 330. The row lines may be selectively activated in sequence by row drivers 320 in response to row address decoder 310 and the column select lines may be selectively activated in sequence for each row activation by column driver 350 in response to column address decoder 360. One example sequence is described below.

As shown in FIG. 3, CMOS image sensor 301 is operated by timing and control circuit 340, which controls address decoders 310 and 360 to select appropriate row and column lines for pixel readout and controls row and column driver circuitry 320 and 350 to apply driving voltages to the drive transistors (not shown) of the selected row and column lines.

An example of a sequence by which row and column lines may be activated is referred to as a global shutter. In a global shutter, all rows in the array are reset and integrated concurrently. After an integration period, individual rows may be read out sequentially, one row at a time.

Another example sequence by which rows of pixels may be reset is referred to as a rolling shutter. In a rolling shutter, the reset and integration process occurs one row at a time. That is, a first row in the array may be reset and integrated. After the first row meets the integration time, it may be read. The process continues to reset, integrate and read sequential rows as they meet the integration time. Therefore, during the rolling shutter, one row may be integrating while another row is being read.

Figure 4:
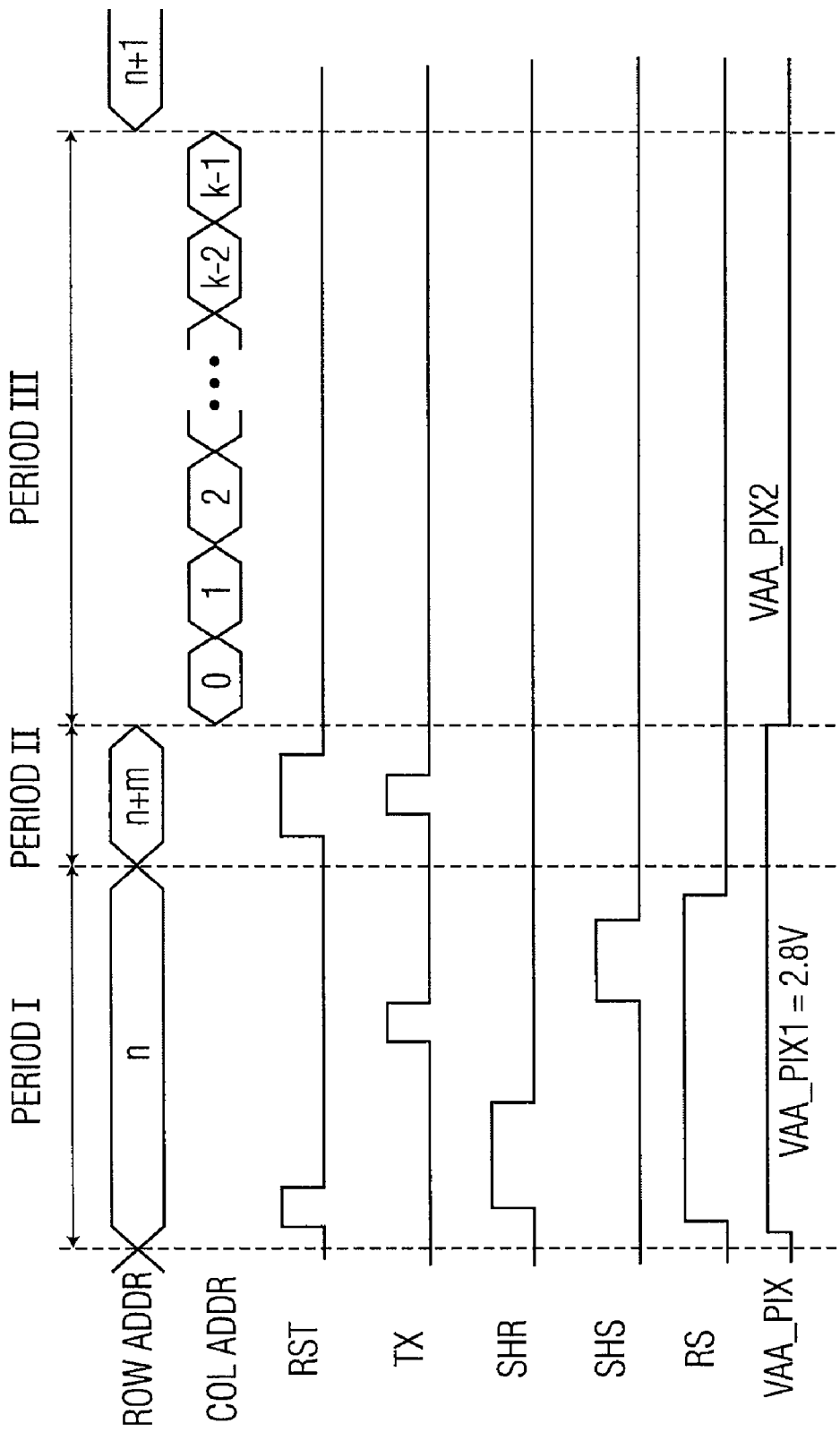
FIG. 4 is a timing diagram for operation of the image sensor of FIG. 3.

FIG. 4 shows a timing diagram for image sensor 301 during a rolling shutter. While this example is shown and described in terms of a rolling shutter, this is not intended to limit the present invention to use of a rolling shutter operation. It is contemplated that the present invention may use other sequences such as, for example, the global shutter described above.

In FIG. 4, period I represents operation during pixel to column readout of the n(th) row, period II represents operation during reset of the (n+m)th row, and period III represents operation during column readout of the n(th) row. The sequence of period I and period II can be swapped. Further, "Row Addr" represents the address of the selected row during each period and "Col Addr" represents the address of the column being read out during each period. Signals SHR and SHS are control signals for Vrst and Vsig sample and hold, respectively. Signals RST, TX, RS and VAA_pix correspond, respectively, to RST, TX, RS and VAA_pix of FIG. 1.

During pixel to column readout period I, row n is selected by applying a signal RS to the row select line corresponding to row n, thereby turning on a row select transistor 70 for each pixel in row n. Next, reset signal RST is applied to reset transistor 40, applying VAA_pix to floating diffusion region 50 of each pixel in row n, thereby resetting respective floating diffusion region 50. Next, the SHR command causes sampling of Vrst from each pixel in row n to sample and hold circuitry 370. Thereafter, TX may be applied to transfer gates 30, transferring a signal representing the level of respective photodiode 20 to respective floating diffusion 50, for each pixel in row n. Then, the SHS command causes sampling of Vsig from each pixel in row n to sample and hold circuitry 370. Throughout period I, VAA_pix may remain at a relatively high voltage (e.g., 2.8v) to allow respective floating diffusion regions 50 to reset to a relatively high voltage.

During period II, floating diffusion region 50 and photodiode 20 of each pixel in row (n+m) is reset. To accomplish this, the RST signal is applied to a respective reset transistor 40 and the TX signal is applied to a respective transfer gate 30, thereby applying VAA_pix to a respective photodiode 20 and floating diffusion region 50. Throughout period II, Vaa_pix remains at a relatively high voltage (e.g., 2.8v) to allow a respective floating diffusion region 50 to reset to a relatively high voltage and to allow a respective photodiode 20 to be fully depleted. When photodiode 20 is fully depleted, the photodiode returns to its respective pinned voltage (e.g., 1.5v).

At the end of pixel to column readout during period I for the (n)th row, Vrst and Vsig for each pixel in the (n)th row may be stored in column sample and hold capacitors in sample and hold circuitry 370. During period III for the (n)th row, column readout may take place. Here, the signals on sample and hold capacitors for each pixel in the row may be transferred to differential amplifier 380. As described above, differential amplifier 380 may provide signal (Vsig−Vrst) to ADC 390, which may convert signals (Vsig−Vrst) for each read out pixel into digital signals.

In a conventional imager, VAA_pix remains relatively high throughout all three periods described above. For example, in one conventional imager, the VAA_pix may remain at 2.8v for mobile applications and at 3.3v for digital camera applications. Maintaining VAA_pix at a voltage higher than the pinned voltage of the photodiode (e.g., 1.5v), however, may generate an electrical field between the VAA_pix node and the photodiode. This may cause the photodiode depletion region to be pulled closer to the STI edge, as shown in the example provided in FIG. 5. As shown, when VAA_pix (represented by Vd in FIG. 5) is 2.8 V, for example, depletion edges 5a touch STI edges 6. Accordingly, dark current may increase when the depletion edge touches the STI edges as a result of VAA_pix being set at 2.8 V.

In the embodiment of the present invention, shown in FIG. 4, on the other hand, VAA_pix remains relatively high (e.g., 2.8v) during pixel readout period I and reset period II. During column readout period III, however, VAA_pix is reduced to a relatively low voltage.

Figure 5:
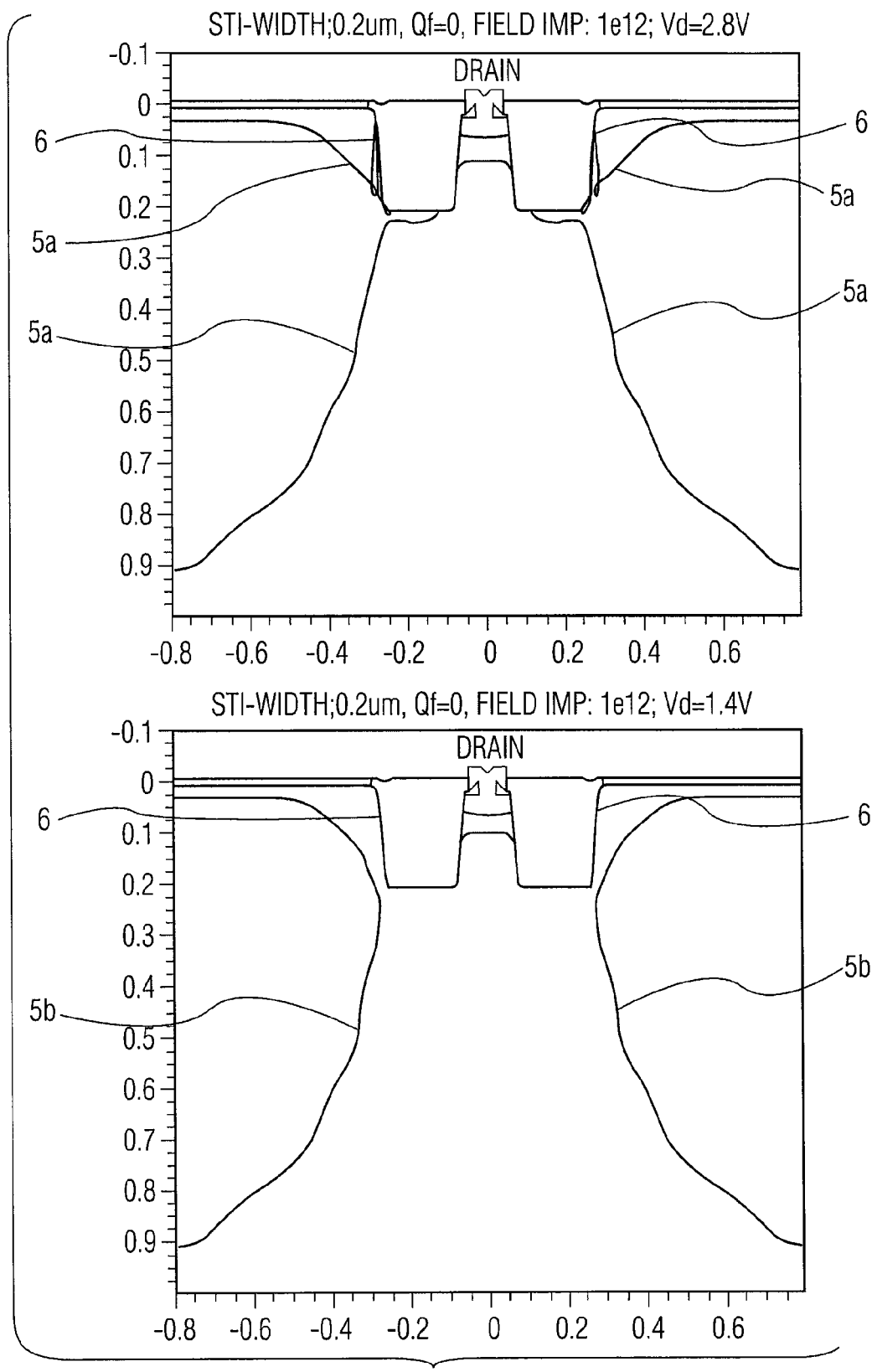
FIG. 5 are graphs showing test results of the operation of the image sensor of FIG. 3.

When VAA_pix is reduced to a relatively low voltage during column readout period III, the electrical field between the VAA_pix node and the photodiode is substantially reduced as compared to conventional imagers. When VAA_pix is set to equal the pinned voltage of the photodiode (e.g., VAA_pix=1.5v), the electrical field is substantially reduced. With a weak electrical field or with no electrical field, as the case may be, the depletion region of the photodiode remains spaced apart from the STI edge, as shown in FIG. 5. As shown, when VAA_pix is, for example, 1.4 V, the depletion edge 5b does not touch STI edges 6. As a result, dark current generated close to the photodiode may be substantially reduced.

This embodiment also permits high voltage reset of the floating diffusion region during pixel to column readout period I and reset period II and a full depletion of the photodiode to its pinned voltage during reset period II. This is so because VAA_pix remains relatively high (e.g., 2.8v) throughout both periods. Because VAA_pix is not used to reset the floating diffusion region or photodiode during column readout period III, however, VAA_pix may be reduced during the column readout period III without significantly affecting the operation of the image sensor. This results in reduced dark current in the photodiode.

In one embodiment, VAA_pix may be reduced during column readout period III to a lower voltage, for example, in the range of 1.0v to 1.5v. This voltage range during period III may be desirable for at least one reason. As VAA_pix approaches 0v, the electrical field between the VAA_pix node and the photodiode changes such that the relatively low potential VAA_pix node acts as a hot electron generator. That is, the VAA_pix node injects a relatively large amount of hot electrons into the photodiode. Accordingly, it may be desirable to reduce VAA_pix to a voltage between 1.0v and 1.5v during column readout period III to reduce dark current in the photodiode and to prevent injection of hot electrons into the photodiode.

While the above-described embodiments describe reducing VAA_pix during period III, it is within the scope of the embodiments of the present invention to maintain VAA_pix at a lower voltage whenever possible, except during reset of the photodiode or when signal readout is occurring. By way of example, VAA_pix may be maintained at a lower voltage during column readout (as previously described) or during integration of the photodiode whenever possible (such as during longer integration times when neither signal readout or reset of the pixel is taking place).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A pixel cell coupled to a column readout circuit, the pixel cell comprising:
    a photosensor having a depletion region,
    a shallow trench isolation (STI) region proximate to the photosensor,
    a floating diffusion region coupled to the photosensor by way of a charge transfer transistor,
    an array pixel supply voltage configured to control a size of the depletion region, and
    a reset transistor connected between the floating diffusion region and the array pixel supply voltage,
    wherein the array pixel supply voltage includes first and second voltages, the array pixel supply voltage: 1) supplying the first voltage in a pixel to column readout period including a transfer of a charge from the photosensor to the floating diffusion region, and 2) supplying the second voltage in a column readout period including readout of the pixel cell by the column readout circuit, after a transfer of the charge from the floating diffusion region to the column readout circuit, and
    the depletion region has a first size such that the depletion region is spaced apart from the STI region with respect to the first voltage and the depletion region has a second size, responsive to the second voltage, such that the depletion region remains spaced apart from the STI region.

2. The pixel cell of claim 1, wherein
    the reset transistor resets both the floating diffusion region and the photosensor in a reset period, after the transfer of the charge to the column readout circuit, and
    the array pixel supply voltage supplies the second voltage after the reset transistor resets the floating diffusion region and the photosensor.

3. The pixel cell of claim 2, wherein
    the array pixel supply voltage supplies the first voltage before the transfer of the charge to the column readout circuit.

4. The pixel cell of claim 1 including a row select transistor and a source follower transistor serially connected between the array pixel supply voltage and a column line,
    wherein the column line provides a readout voltage, $V_{out}$, corresponding to the charge transferred to the column readout circuit.

5. The pixel cell of claim 1, wherein
    the first voltage is equal to or greater than approximately 2.8v, and
    the second voltage is approximately equal to 1.4v or less.

6. The pixel cell of claim 1, wherein
    the column readout circuit includes a sample-and-hold capacitor for sampling the charge transferred from the floating diffusion region,
    the array pixel supply voltage supplies the first voltage before the sample-and-hold capacitor samples the transferred charge, and
    the array pixel supply voltage supplies the second voltage after the sample-and-hold capacitor samples the transferred charge.

7. A pixel sensor comprising:
    a photodiode having a depletion region and a floating diffusion region coupled to the photodiode,
    a shallow trench isolation (STI) region proximate to the photodiode,
    a transfer transistor connected between the photodiode and the floating diffusion region,
    a supply voltage, Vaa-pix, configured to control a size of the depletion region,
    a reset transistor connected between the supply voltage, Vaa-pix, and the floating diffusion region, and
    a source follower transistor and a row select transistor serially connected between the supply voltage Vaa-pix and a column line,
    wherein the reset transistor is first activated to reset the photodiode and the floating diffusion region in a pixel to column readout period, prior to the transfer transistor transferring a charge from the photodiode to the floating diffusion region,
    the reset transistor is second activated to reset the photodiode and the floating diffusion region in a reset period, after the row select transistor provides a voltage output signal on the column line,
    the supply voltage, Vaa-pix, supplies a first voltage in the pixel to column readout period before the first activation of the reset transistor,
    the supply voltage, Vaa-pix, supplies a second voltage in a column readout period after the reset period, such that the second voltage is supplied after the second activation of the reset transistor, and
    the depletion region has a first size such that the depletion region is spaced apart from the STI region with respect to the first voltage and the depletion region has a second size, responsive to the second voltage, such that the depletion region remains spaced apart from the STI region.

8. The pixel sensor of claim 7, wherein
the first voltage is larger than the second voltage.

9. The pixel sensor of claim 7, wherein
the first voltage is set for an entire duration between the first and second activation of the reset transistor.

10. A method of operating a pixel cell having a photosensor including a depletion region, a shallow trench isolation (STI) region proximate to the photosensor and a reset transistor, the method comprising:

applying a first voltage to a Vaa-pix node connected to a drain of the reset transistor in a pixel to column readout period and performing the following steps, during application of the first voltage:

generating a reset signal at a gate of the reset transistor;

transferring a charge from the photosensor to a floating diffusion region connected to a source of the reset transistor; and transferring the charge from the floating diffusion region to a readout circuit, coupled to the pixel cell; and applying a second voltage to the Vaa-pix node in a column readout period and performing the following steps, during application of the second voltage:

adjusting a size of the depletion region, responsive to the second voltage, such that the depletion region is spaced apart from the STI region; and integrating the charge for signal output from the readout circuit.

11. The method of claim 10, wherein
applying the first voltage includes applying a larger voltage than the second voltage.

12. The method of claim 10, wherein
the first voltage is applied before the second voltage.

13. The method of claim 10, wherein applying the first voltage includes
applying a voltage that is greater than the second voltage by at least one volt.

14. The method of claim 10, the applying of the second voltage includes reducing an electric field between the Vaa-pix node and the photosensor.

* * * * *